US005968851A

United States Patent [19]

Geha et al.

[11] Patent Number: 5,968,851

[45] Date of Patent: Oct. 19, 1999

[54] CONTROLLED ISOTROPIC ETCH PROCESS AND METHOD OF FORMING AN OPENING IN A DIELECTRIC LAYER

[75] Inventors: Sam Geha, Sunnyvale; Ende Shan, Pleasanton, both of Calif.

[73] Assignee: Cypress Semiconductor Corp., San Jose, Calif.

[21] Appl. No.: 08/820,893

[22] Filed: Mar. 19, 1997

[51] Int. Cl.[6] .................... H01L 21/302

[52] U.S. Cl. .................... 438/756; 438/700; 438/704; 438/974

[58] Field of Search .................... 438/700, 704, 438/756, 757, 974

[56] References Cited

U.S. PATENT DOCUMENTS

| | | | |
|---|---|---|---|
| 4,104,084 | 8/1978 | Evans, Jr. | 136/89 CC |
| 4,330,569 | 5/1982 | Gulett et al. | 427/38 |
| 5,032,203 | 7/1991 | Doy et al. | 156/345 |
| 5,043,790 | 8/1991 | Butler | 357/68 |
| 5,216,281 | 6/1993 | Butler | 257/750 |
| 5,219,791 | 6/1993 | Freiberger | 437/195 |
| 5,245,790 | 9/1993 | Jerbic | 51/121 |
| 5,257,478 | 11/1993 | Hyde et al. | 51/131.3 |
| 5,340,370 | 8/1994 | Cadien et al. | 51/308 |
| 5,486,265 | 1/1996 | Salugsugan | 156/636.1 |
| 5,486,267 | 1/1996 | Knight et al. | 156/659.11 |
| 5,514,605 | 5/1996 | Asai et al. | 437/40 |
| 5,552,343 | 9/1996 | Hsu | 437/195 |
| 5,746,884 | 5/1998 | Gupta et al. | 156/643.1 |
| 5,783,495 | 7/1998 | Li et al. | 438/738 |
| 5,807,660 | 9/1998 | Line et al. | 430/313 |

FOREIGN PATENT DOCUMENTS

| | | |
|---|---|---|
| 0 450 572 A2 | 10/1991 | European Pat. Off. . |
| 0 336 679 B1 | 6/1994 | European Pat. Off. . |

OTHER PUBLICATIONS

"Chemical–mechanical polishing of interlayer dielectric: A review", Iqbal All, Sudipto R. Roy, Greg Shinn, Solid State Technology, Oct. 1994, pp. 63–68.

"Developments in Consumables Used in the Chemical Mechanical Polishing of Dielectrics" Srinivasan Sivaram, Robert tolles and Anantha Sethuraman, 2419A International Conference On Solid State Devices & Materials, Aug. 21–24, 1995.

*Primary Examiner*—Bruce Breneman
*Assistant Examiner*—Anita Alanko
*Attorney, Agent, or Firm*—Oblon, Spivak, McClelland, Maier & Neustadt, P.C.

[57] ABSTRACT

The present invention relates to a method of manufacturing an opening through a dielectric layer. The method comprises treating a polished dielectric layer with a wet etch selectively enchancing composition, such as buffered HF, prior to the formation of a patterned photoresist to improve the lateral-to-vertical wet etch ratio.

18 Claims, 2 Drawing Sheets

HF DIP PRIOR TO PR. L/V=1·OO . O·5μm CONTACT

HF DIP PRIOR TO PR. L/V=1·00. 0·5μm CONTACT

STANDARD PROCESS. L/V=1·4. 0·5um CONTACT

VIA X-SECTION WITH PHOTORESIST

CONTROLLED ISOTROPIC ETCH PROCESS AND METHOD OF FORMING AN OPENING IN A DIELECTRIC LAYER

BACKGROUND OF THE INVENTION

1. Field of the Invention

The present invention relates to a method of manufacturing an opening through a dielectric layer.

2. Discussion of the Background

During the production of integrated circuits, it is often necessary to form vias to conducting regions underlying a dielectric layer. A common technique for etching overlaying dielectric layers is photolithography, in which light is used to form a pattern on a photosensitive film which has been deposited on the surface of a dielectric layer. Development of the resist results in a pattern, in which portions of the oxide are exposed. The exposed portions of the oxide may then be subject to selective etching.

When an opening is filled with a metal, especially aluminum, it is sometimes advantageous to round the top of the opening, forming "ears" on the upper portion of the opening. Rounding may typically be performed by a wet isotropic etching of the dielectric layer and overlying patterned resist, prior to dry anisotropic etching. Rounding provides for greater filling capability, especially when aluminum is the filling metal.

Increasing demands are being placed on the size of integrated circuits, calling for finer and finer resolution capabilities. For example a reliable, efficient process for forming openings of 0.5 μm diameter is highly desired.

However, during wet isotropic etching of the patterned dielectric layer, excessive lateral etching of dielectric material directly underlying the patterned photoresist is common, resulting in a loss of resolution. Such non-selective etching creates a barrier to further size reduction of integrated circuits such that an efficient method of etching which provides for high selectivity, and in particular low L/V ratios would be welcome.

SUMMARY OF THE INVENTION

Accordingly, it is one object of the present invention to provide a reliable, efficient and selective method of etching an opening through a dielectric layer.

It is another object of the present invention to provide a method of forming an opening in a dielectric layer.

It is another object of the present invention to provide an opening to a conducting region, through a dielectric layer.

It is another object of the present invention to provide a method of enhancing adhesion of a photoresist material to an underlying dielectric layer.

These and other objects of the present invention are provided by an etch process, in which, prior to forming a photoresist layer, the underlying dielectric layer is treated with a composition that improves the lateral-to-vertical wet etch ratio relative to the same etch process conducted in the absence of such a treatment step.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Generally, an opening through a dielectric exposing a diffusion region or an opening through a dielectric layer between (a) a semiconductor substrate or a polysilicon layer and (b) the first metal layer is called a "contact opening", while an opening in other oxide layers such as an opening through an intermetal dielectric layer is referred to as a "via" or "via channel". As used herein, an "opening" will be understood to refer to any type of opening through any type of dielectric layer, regardless of the layer exposed or function of the opening. Furthermore, a "(semi)conductive layer" refers to a layer of either a conventional semiconductive material (that may be conventionally doped) or a conventional conductive material.

The present process provides for an etch method providing an opening with a low L/V ratio. The present method is especially advantageous for an opening having a diameter of ≦0.5 μm.

A non-limiting example of a suitable ratio of Lateral undercut/Vertical etch (L/V) is from 1 to 1.3. Preferably, the L/V is less than 1.3, more preferably less than 1.2, even more preferably less than 1.1, and most preferably less than 1.05.

Figure 1:
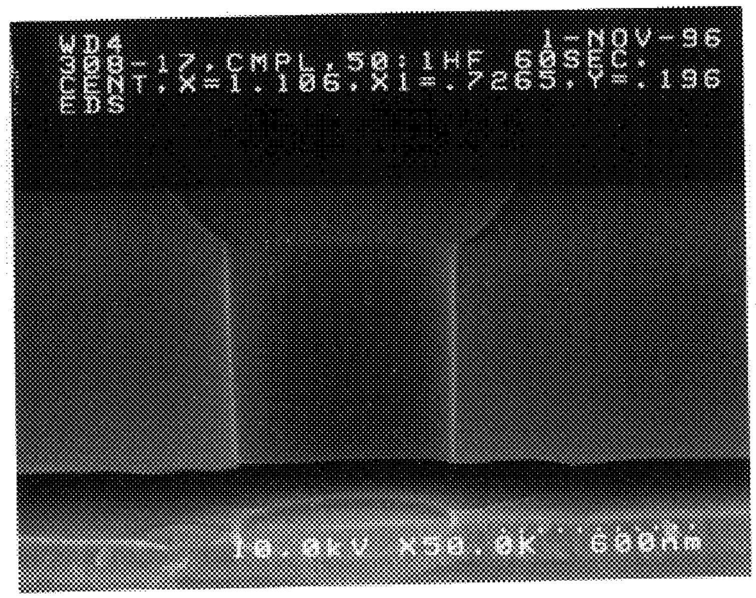
FIG. 1 is a scanning electron micrograph (SEM) of a 0.5 μm opening, having a lateral-to-vertical etch ratio (L/V) of 1.00, in which the dielectric layer was surface treated with an HF composition, after conventional CMP but prior to deposition of the photoresist layer.
Figure 2:
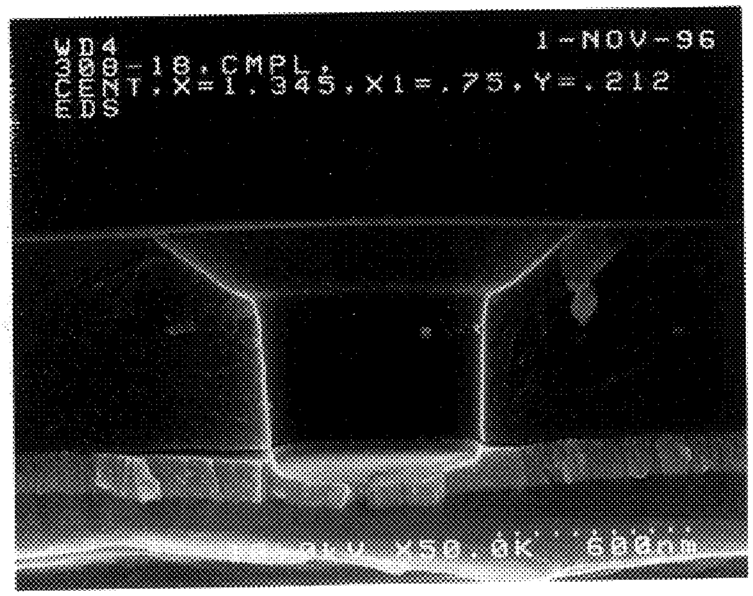
FIG. 2 is a SEM of a 0.5 μm opening, having an L/V of 1.40, formed by the same process as that used in forming the opening of FIG. 1, but in which the surface treatment step was omitted.
Figure 3:
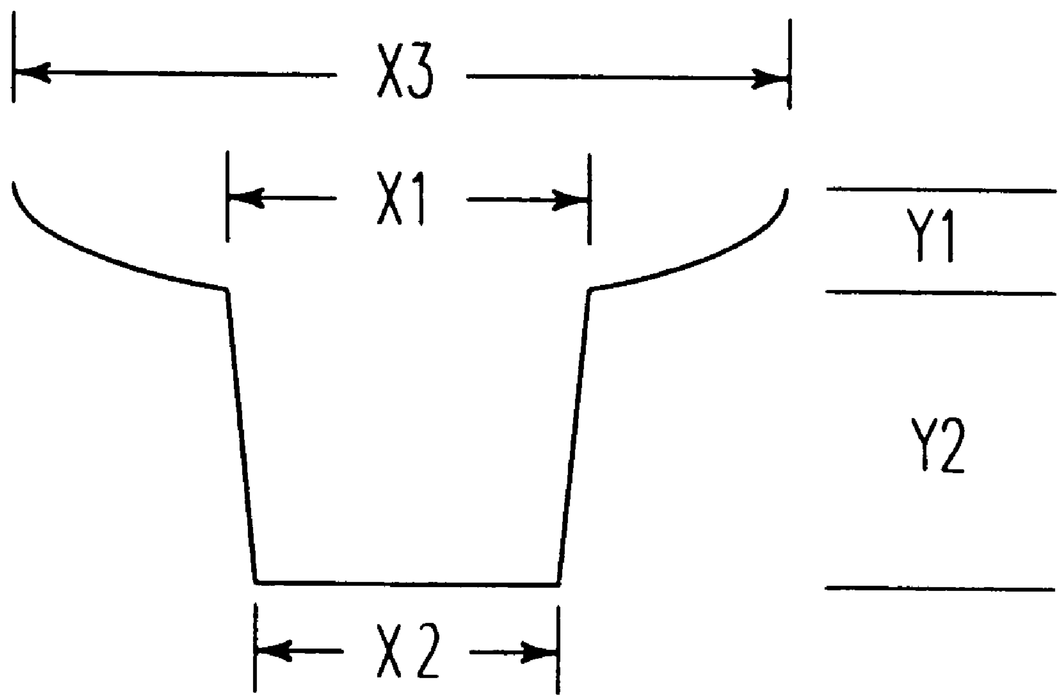
FIG. 3 shows a cross section of an opening without the photoresist.

L/V is calculated as ((X3−X1)/2Y1), where X3, X1 and Y1 are as identified in FIG. 3.

Typically, the opening will have a sidewall slope of from 85–90°, more preferably from 85–87°, as measured by a=Arctan (Y2/X1−X2)/2, where Y2, X1 and X2 are as identified in FIG. 3.

The present method is preferably practiced on a multi layer substrate comprising a conductive layer and a dielectric layer thereon.

Non-limiting examples of suitable conductive layers include a metal such as aluminum, polysilicon (which may be conventionally doped with n-dopants such a phosphorous, arsenic, antimony, sulfur, etc. or with p-dopants such as boron), titanium, tungsten, copper, conductive alloys thereof such as aluminum-copper and titanium-tungsten alloy, etc. Most preferably the conductive layer comprises aluminum.

Non-limiting examples of suitable dielectric layers include a $SiO_2$ based layer such as silicon dioxide (which may be conventionally doped with boron and or phosphorous), silicon nitride ($Si_xN_y$), a conventional oxide/nitride/oxide, an oxynitride or a low K dielectric such as $SiO_2$ doped with either F, C or both. More preferably the dielectric layer is $SiO_2$. Additional examples of dielectric materials include borophosphosilicate glass (BPSG), borosilicate glass (BSG), phosphosilicate glass, spin-on glass (SOG), P-doped silicon oxide (P-glass), F-doped silicon dioxide, C-doped silicon dioxide, a silicon oxynitride (e.g. of the general formula $[Si_aO_xN_y]$ such that (x/2)+(3y/4)=a), $Al_2O_3$, metal nitrides such as aluminum nitride [e.g. AlN], $V_2O_5$, tetraethylorthosilicate-based oxides and titanium oxide, aluminum oxynitrides (e.g. of the general formula $[Al_bO_xN_y]$ such that (2x/3)+y=b), aluminosilicates and nitrides thereof (e.g. of the general formula $[Si_aAl_bO_xN_y]$ where x=2a+3b/2 and y=4a/3+b), boron- and/or phosphorous doped aluminates and aluminosilicates.

The thickness of the dielectric layer is not particularly limited, but preferably is in the range of about 0.3–2 μm, more preferably 0.5–1.8 μm, even more preferably 0.7 to 1.5 μm. The dielectric layer may comprise a single dielectric material. However, it may also comprise multiple layers of the same or different dielectric materials.

The photoresist layer may be chosen from among those conventionally used by those of ordinary skill in the art. Either or both positive and/or negative resist layers may be used. Negative resist materials may contain chemically inert polymer components such as rubber and/or photoreactive agents that react with light to form cross-links, e.g. with the rubber. When placed in an organic developer solvent, the unexposed and unpolymerized resist dissolves, leaving a polymeric pattern in the exposed regions. The preparation of suitable negative resist materials is within the level of skill of one of ordinary skill in the art without undue experimentation. Specific non-limiting examples of suitable negative resist systems include cresol epoxy novolac-based negative resists as well as negative resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Positive resists have photoreactive components which are destroyed in the regions exposed to light. Typically he resist is removed in an aqueous alkaline solution, here the exposed region dissolves away. The preparation of suitable positive resist materials is within the level of skill of one of ordinary skill in the art without undue experimentation. Specific non-limiting examples of suitable positive resist systems include Shipley XP9402, JSR KRK-K2G and JSR KRF-L7 positive resists as well as positive resists containing the photoreactive polymers described in Kirk-Othmer Encyclopedia of Chemical Technology, 3rd Edition, vol 17, entitled "Photoreactive Polymers", pages 680–708, the relevant portions of which are hereby incorporated by references.

Exemplary resist materials are also described by Bayer et al, IBM Tech. Discl. Bull. (USA) vol. 22, No. 5, (October 1979), pp. 1855; Tabei, U.S. Pat. No. 4,613,404; Taylor et al, J. Vac. Sci., Technol. B. Vol. 13, No. 6, (1995), pp. 3078–3081; Argritis et al, J. Vac. Sci., Technol. B., Vol. 13, No. 6, (1995), pp. 3030–3034; Itani et al, J. Vac. Sci, Technol. B. Vol 13, No. 6, (1995), pp. 3026–3029; Ohfuli et al, J. Vac. Sci, Technol. B. Vol. 13, No. 6, (1995), pp. 3022–3025; Trichkov et al, J. Vac. Sci., Technol. B. Vol. 13, No. 6, (1995), pp. 2986–2993; Capodieci et al, J. Vac. Sci, Technol. B. Vol. 13, No. 6, (1995), pp. 29632967; Zuniga et al, J. Vac. Sci, Technol. B. Vol. 13, No. 6, (1995), pp. 2957–2962; Xiao et al, J. Vac. Sci, Technol. B. Vol. 13, No. 6, (1995), pp. 2897–2903; Tan et al J. Vac. Sci, Technol. B. Vol. 13, No. 6, (1995), pp. 2539–2544; and Mayone et al J. Vac. Sci, Technol. Vol. 12, No. 6, pp. 1382–1382. The relevant portions of the above-identified references which describe the preparation of resist materials is hereby incorporated by reference.

It is also within the scope of the present invention to use an adhesion enhancing agent in the photoresist material to promote the adhesion of the photoresist to the underlying dielectric material. The adhesion enhancing agent may be added to the photoresist material or may be applied as a separate layer between the photoresist and the underlying dielectric material layer. Such adhesion enhancing agents include those conventionally known to those of ordinary skill in the art.

The conductive layer may be formed by conventional methods known to those of ordinary skill in the art. Non-limiting examples of methods of forming the conductive layer include sputtering, chemical vapor deposition (CVD), plasma-enhanced CVD, etc, preferably sputtering.

The thickness of the conductive layer is not particularly limited. However, in a preferred embodiment, the thickness of the conductive layer is about 0.4–4.0 μm, even more preferably 0.4–3.0 μm, and most preferably 0.7–2.5 μm.

The dielectric layer may be formed by conventional techniques known to those of ordinary skill in the art, for example, by atmospheric pressure chemical vapor deposition (APCVD), low pressure chemical vapor deposition (LPCVD), plasma-enhanced chemical vapor deposition (PECVD), sputtering or thermal growth (e.g. steam oxidation or dry oxidation of silicon).

The diameter of the hole formed for the opening is not particularly limited. However, the diameter of the opening is preferably from 0.1 to 1.5 μm. Specific examples of the diameter of the hole of the opening are 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.00, 1.05, 1.10, 1.15, 1.20, 1.25, 1.30, 1.35, 1.40, 1.45 and 1.50 μm.

Prior to deposition of the photoresist layer, the exposed surface of the dielectric layer may be subjected to a conventional chemical-mechanical polish (CMP). Typically CMP comprises mild etching with an etchant such as $NH_4OH$, $H_2O_2$, $FeNO_3$ or a combination thereof, in the presence of an abrasive slurry comprising an aqueous suspension of silica, alumina, or a combination thereof. As a result of CMP, the surface roughness of the exposed dielectric layer will generally have a roughness Ra of about 3 Å, as measured by AFM techniques. Suitable CMP techniques are described by All et al., Solid-State Technology, October 1994, pp. 63–68; Sivaram et al., at the International Conference on Solid State Devices & Materials, Aug. 21–24, 1995, Yokohama, JP (1995) August 21, Tokyo, JP, Salugsugan U.S. Pat. No. 5,486,265, Cadien et al. U.S. Pat. No. 5,340,370, Jerbic, U.S. Pat. No. 5,245,790, Hyde et al., U.S. Pat. No. 5,257,478, and Doy et al., U.S. Pat. No. 5,032,203.

After CMP, and prior to deposition of the photoresist material, the present method provides for a separate surface treatment of the exposed surface of the dielectric layer, with a wet etch selectivity-enhancing composition. Preferably, the surface treating step provides an exposed surface roughness Ra of from 3.5–5 Å, more preferably 4–5 Å, more preferably about 4.8 Å as measured by AFM techniques. Such a surface roughness may be obtained by chemical etching using aqueous HF, which may be diluted and/or buffered, e.g. with aqueous ammonium fluoride. Examples of suitable HF buffering ratios (e.g. parts by weight of 40% aqueous $NH_4F$ to parts by weight of concentrated HF) include 2:1 to 200:1, preferably 5:1 to 100:1, more preferably 10:1 to 80:1, even more preferably about 15:1 to 50:1 and most preferably about 15:1. An example of a commercially available etching material is BHF 15:1 LP W/FC93 by Ashland Chemical Co.

Typically, a buffered oxide etch (BOE) is conducted for a length of time sufficient to remove approximately 50–100 Å of dielectric layer, to result in the desired surface roughness and/or L/V ratio. For example, when an HF buffering ratio of 50:1 is selected, surface etching may be conducted for about 60 seconds.

The surface treated dielectric layer is then ready to receive a photoresist material. The photoresist may be applied by conventional methods known to those of ordinary skill in the art. Non-limiting examples of suitable techniques for applying a photoresist will include spraying, roller coating and spin coating. In a preferred embodiment, spin coating is used to deposit the photoresist film. The thickness of the photoresist material may vary depending upon the application. However, generally a resist having a thickness of at least 500 nm, more preferably 700 nm to 1.5 $\mu$m, is used.

Patterning and developing of the resist material may be conducted by conventional methods known to those of ordinary skill in the art. After patterning and developing, hard baking of the resist may be conducted by conventional methods known to those of ordinary skill in the art. Hard baking is typically performed sufficiently to prevent photoresist lifting from the underlying dielectric layer during wet etching, for example for about 40 minutes at 115° C.

In a preferred embodiment, the developed resist material is subjected to "descum" process comprising exposing the wafer to an $O_2$ plasma sufficiently to remove residual portions of the resist material from the surface of the exposed dielectric. Non-limiting descumming conditions include exposing for about 5 min at about 0.6 torr, in an $O_2$ or $O_2$-containing atmosphere at about 100 watts power.

Wet etching of the dielectric layer may be conducted by conventional methods known to those of ordinary skill in the art such as immersing the patterned wafer in an etching agent (e.g. aqueous buffered HF having a buffering ratio of from 2:1 to 50:1, preferably from 4:1 to 30:1, more preferably 6:1 to 20:1, and most preferably about 15:1, for a length of time sufficient to remove from 10 to 60% of the exposed dielectric layer (e.g. Y1/(Y1+Y2)×100% where Y1 and Y2 are as defined in FIG. 3), preferably from 15 to 50%, more preferably about 20%.

Wet etching may be followed by a dry anisotropic etch to produce the opening. Dry anisotropic etching may be conducted by conventional methods known to those of ordinary skill in the art for the etching of openings through a dielectric. Non-limiting examples of dry isotropic etch machines include CTI Drytek and Mattson Lite Etch. Etchants such as $SF_6$, $Cl_2$, $C_nH_xF_y$ (where n≧1, y≧1, and x+y=2n+2, preferably a mixture of $CHF_3/C_2F_6$ [see, for example, U.S. Ser. No. 08/683,407 and/or U.S. Pat. No. 5,468,342, the relevant portions of which are hereby incorporated by reference]), HF, HCl, $CCl_4$ and mixtures thereof may be used in conventional reactive ion etching. Dry etching may also be conducted by conventional RF etching. In a preferred embodiment, etching is conducted using a commercially available plasma etcher (e.g. from DRYTEK, Inc. of Wilmington, Mass. and Santa Clara, Calif.) and a $CHF_3/C_2F_6$ etch chemistry according to the manufacturer's instructions.

After an opening has been etched in the dielectric material, an optional liner layer material may be deposited into the opening. The liner layer may inhibit or prevent migration of atoms between layers adjacent to the liner layer (e.g. silicon and/or oxygen from the underlying dielectric layer into, e.g., an overlying Al conductive layer and/or vice versa).

Non-limiting examples of suitable liner layer materials include titanium, zirconium, hafnium, chromium, molybdenum, tungsten, copper, nickel and cobalt; alloys thereof such as titanium-tungsten and titanium nitride, etc. The liner layer may also promote adherence of the via conductive material to the side walls of the dielectric material as well as to the material of the conductive region layer there below (e.g. a metal such as tungsten or Al or doped polysilicon). Preferably the liner layer is a titanium-tungsten alloy or titanium nitride.

The liner layer may be deposited by conventional methods known to those of ordinary skill in the art such as chemical or plasma vapor deposition, ionized metal plasma vapor deposition, sputtering, etc.

While the optional liner layer may be deposited in an amount sufficient to cover the entire exposed surface of the wafer, it is also be deposited in an amount sufficient to cover the uppermost surface of the dielectric layer and on the side walls of the opening.

The thickness of the liner layer on the side walls is typically, but not necessarily, greater than that deposited at the bottom of the opening. The ratio of the average thickness of the liner layer deposited on the side wall to the average thickness of the liner layer deposited at the bottom of the opening may be >1, and may even by ≧1.2.

Within the context of the present invention, the liner layer will appear, at least, between the dielectric material and the conductive materials of the via. However, the liner layer need not form a continuous barrier between the dielectric material and the conductive material of the via and may appear on only a portion or portions of the side wall of the dielectric material.

Before and/or after deposition of the liner layer, it is possible to deposit a layer of an additional conductive material having a thickness which is also suitable the liner layer (e.g. ≦500 Å, preferably ≦450 Å, more preferably ≦400 Å, and most preferably 100–300 Å). The additional conductive material may form a barrier to migration of atoms from materials below the additional conductive material to materials above the additional conductive material, and/or may serve as an etch stop layer. Non-limiting examples of suitable additional conductive materials include titanium, zirconium, hafnium, chromium, molybdenum, tungsten, aluminum, copper, nickel and cobalt; silicides thereof, conductive refractory nitrides thereof, etc. Preferably, the additional conductive material layer is titanium.

The additional conductive material layer may be formed by conventional physical vapor deposition techniques known to those of ordinary skill in the art, preferably those preferred for depositing the present liner layer. In particular, such a layer may be formed by conventional sputtering or etch sputtering.

After the liner layer has been deposited, a via or plug may be formed by depositing a bulk conductive material into the opening.

Non-limiting examples of suitable bulk conductive materials are titanium, zirconium, hafnium, chromium, molybdenum, tungsten, aluminum, polysilicon, copper, alloys thereof such as titanium-tungsten, tungsten silicide, titanium silicide etc. Preferably the conductive material is tungsten, copper or aluminum, and more preferably aluminum.

The conductive material may be deposited by conventional methods known to those of ordinary skill in the art, such as by atmospheric pressure Chemical Vapor Deposition (APCVD), low pressure Chemical Vapor Deposition (LPCVD), plasma-enhanced Chemical Vapor Deposition (PECVD), conventional sputtering, collimated sputtering, or thermal or epitaxial growth. Preferably the conductive material is deposited by chemical vapor deposition. When tungsten is deposited, a reactive gas mixture comprising $WF_6$ and $SiH_4$ (which may further comprise $H_2$) may be used.

After deposition of the bulk conductive material, further processing may include an etch back or planarization step, preferably planarizing using conventional Chemical Mechanical Polishing (CMP). Thereafter, a further metal layer may be (a) deposited on the planarized bulk conductive material and (b) conventionally patterned to form conventional local interconnects, straps, bit lines, word lines and/or busses.

Obviously, numerous modifications and variations of the present invention are possible in light of the above teachings. It is therefore to be understood that, within the scope of the appended claims, the invention may be practiced otherwise than as specifically described herein.

What is claimed as new and desired to be secured by Letters Patent of the United States is:

1. A method of forming an opening through a dielectric layer of a substrate comprising:

a) a dielectric layer; and b) a (semi)conductive layer there below;

said method comprising the sequential steps of:

i) polishing an exposed surface of said dielectric layer;

ii) treating said dielectric layer with a wet etch selectivity enhancing composition;

iii) depositing and patterning a photoresist layer on said exposed surface of said dielectric layer;

iv) wet etching said dielectric layer; and v) dry etching said dielectric layer to form an opening.

2. The method of claim 1, wherein said opening has a L/V ratio of 1.3 or less.

3. The method of claim 1, wherein said opening has a L/V ratio of 1.2 or less.

4. The method of claim 1, wherein said opening has a diameter of $\leqq 0.5\ \mu m$.

5. The method of claim 1, wherein said wet etch selectivity enhancing composition comprises hydrogen fluoride.

6. The method of claim 5, wherein said wet etch selectivity enhancing composition further comprises aqueous ammonium fluoride.

7. The method of claim 1, further comprising the step of hard-baking said photoresist layer after depositing and patterning said photoresist layer.

8. The method of claim 1, further comprising descumming said photoresist layer after depositing and patterning said photoresist layer.

9. The method of claim 1, wherein said dielectric layer comprises silicon dioxide.

10. The method of claim 1, wherein wet etching of said dielectric layer comprises treating said substrate with an etchant comprising hydrogen fluoride.

11. The method of claim 10, wherein said etchant further comprises aqueous ammonium fluoride.

12. The method of claim 1, wherein said dry etching comprises reactive ion etching.

13. The method of claim 1, wherein said underlying (semi)conductive layer comprises a material selected from the group consisting of aluminum, doped polysilicon, titanium, tungsten, copper, titanium-tungsten alloy and mixtures thereof.

14. The method of claim 1, wherein said polishing method is chemical-mechanical polishing.

15. A method of forming a via comprising:

i) polishing an exposed surface of a dielectric layer of a substrate comprising:

a) a dielectric layer; and b) a (semi)conductive layer there below, ii) treating said dielectric layer with a wet etch selectivity enhancing composition;

iii) depositing and patterning a photoresist layer on said exposed surface of said dielectric layer;

iv) wet etching said dielectric layer;

v) dry etching said dielectric layer to form an opening; and vi) filling said opening with a conductive material.

16. The method of claim 15, wherein said polishing method is chemical-mechanical polishing.

17. The method of claim 15, wherein said conductive material is selected from the group consisting of titanium, zirconium, hafnium, chromium, molybdenum, tungsten, aluminum, polysilicon, copper, titanium-tungsten, tungsten silicide, titanium silicide and mixtures thereof.

18. The method of claim 15, wherein said conductive material is aluminum.

* * * * *